United States Patent [19]
Steele

[11] 3,939,400
[45] Feb. 17, 1976

[54] BATTERY TEST UNIT FOR TESTING BATTERIES WHILE STORED IN A CASSETTE-TYPE PACKAGE

[76] Inventor: Peter F. Steele, 141 Hope St., Stamford, Conn. 06906

[22] Filed: May 23, 1974

[21] Appl. No.: 472,540

[52] U.S. Cl. .............................. 324/29.5; 136/182
[51] Int. Cl.² ....................................... G01N 27/42
[58] Field of Search ............ 324/29.5; 136/182, 177

[56] References Cited
UNITED STATES PATENTS

| | | | |
|---|---|---|---|
| 1,337,160 | 4/1920 | Riebeth ............................ | 324/29.5 |
| 1,887,656 | 11/1932 | Myers ............................. | 324/29.5 X |
| 2,081,656 | 5/1937 | Anthony ......................... | 324/29.5 X |
| 2,093,983 | 9/1937 | Rothenberg ..................... | 324/29.5 |
| 3,586,962 | 6/1971 | Rebstock ......................... | 324/29.5 |

*Primary Examiner*—Alfred E. Smith
*Assistant Examiner*—Rolf Hille
*Attorney, Agent, or Firm*—Parmelee, Johnson & Bollinger

[57] ABSTRACT

A battery test unit for testing batteries while stored in a cassette-type package having an electrically conductive base sheet and a housing, mounted on the base sheet, forming a plurality of individual battery compartments. Each compartment stores an individual battery and has a contact access opening in its cover. The housing and the base sheet are arranged to store each battery with one terminal in electrical contact with the base sheet and the other terminal accessible through the contact access opening in the cover of each compartment.

The battery test unit of this invention is a handheld, manually operated device comprising a body having a receptacle region for receiving the cassette-type package, a selector switch for selectively individually making electrical connection through the cassette access openings with one terminal of each stored battery in the corresponding cassette compartments, a meter for testing each battery selectively connected by the selector switch, and a main contact for making electrical connection with the cassette base sheet.

7 Claims, 7 Drawing Figures

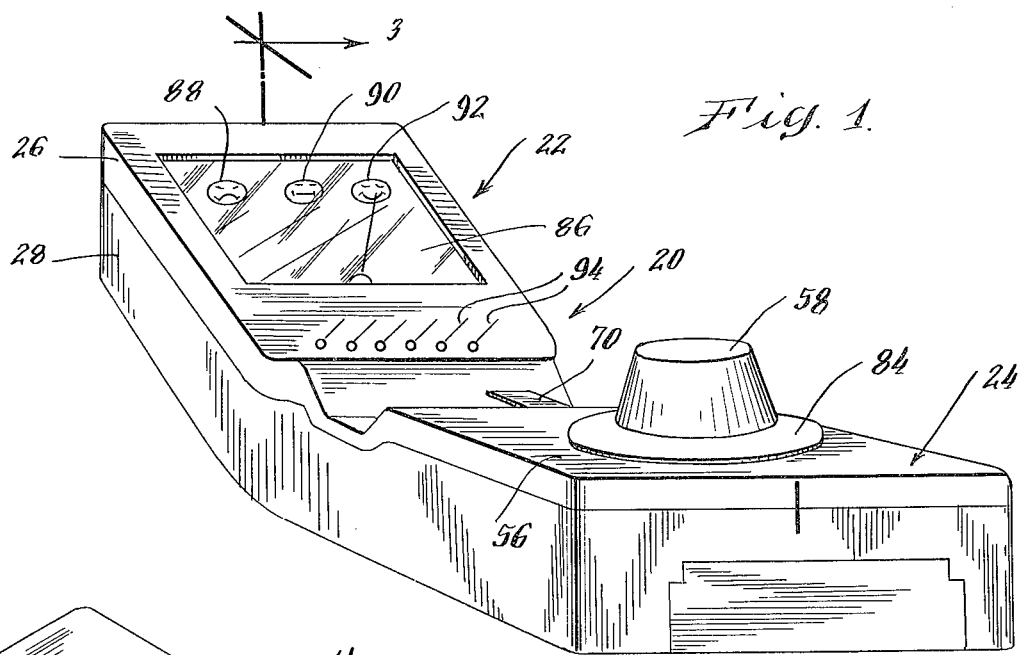
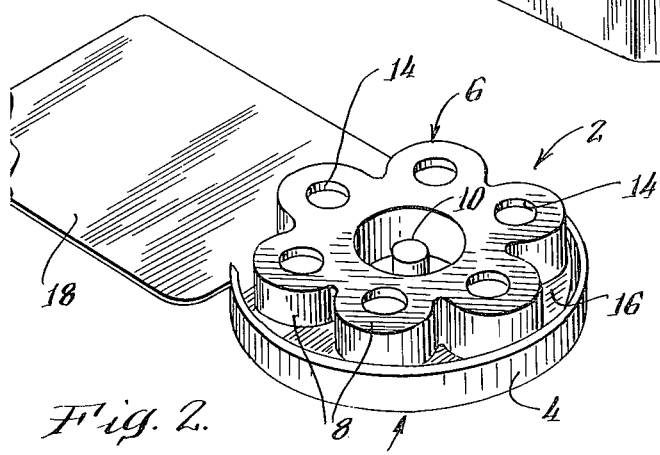
Fig. 2.
CASSETTE-TYPE PACKAGE
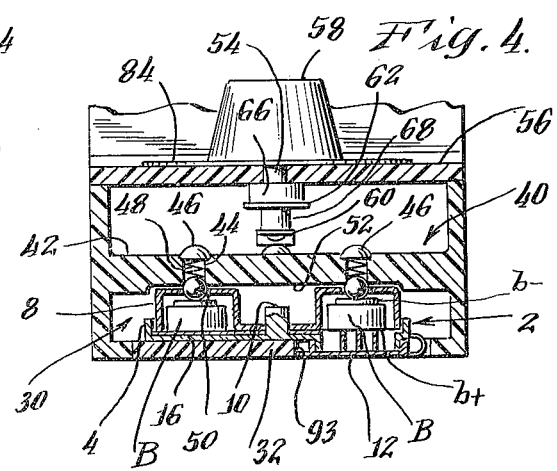
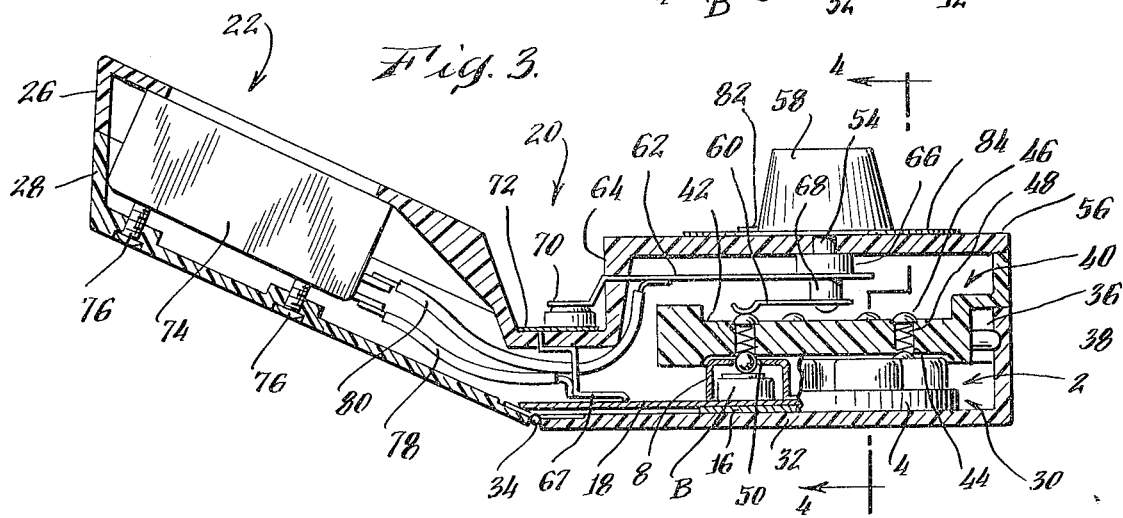

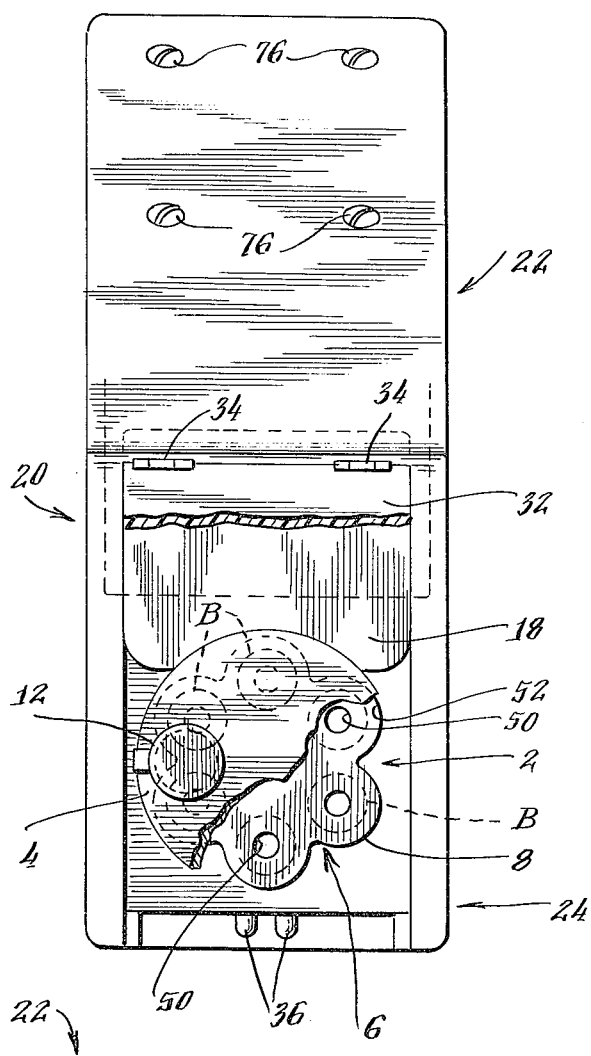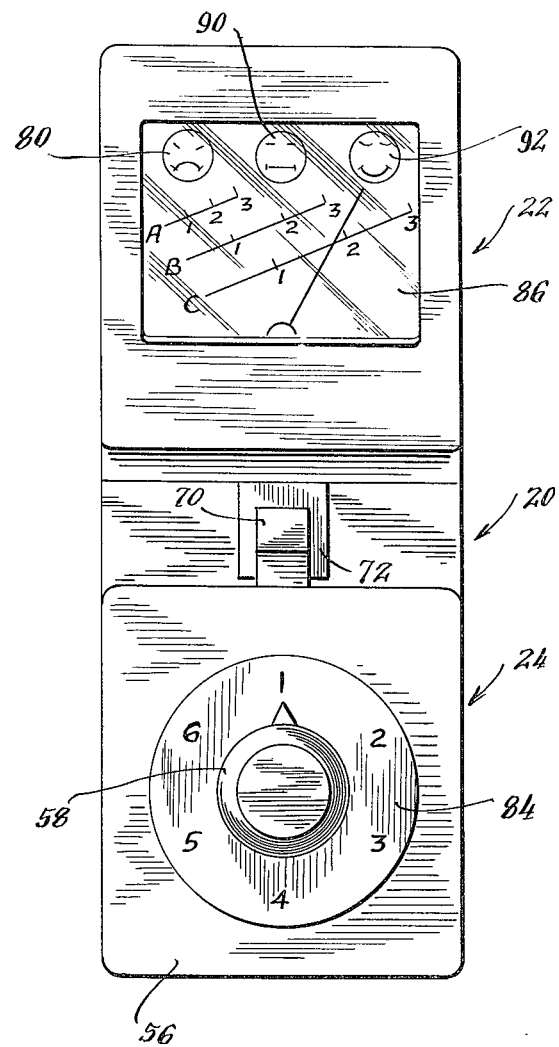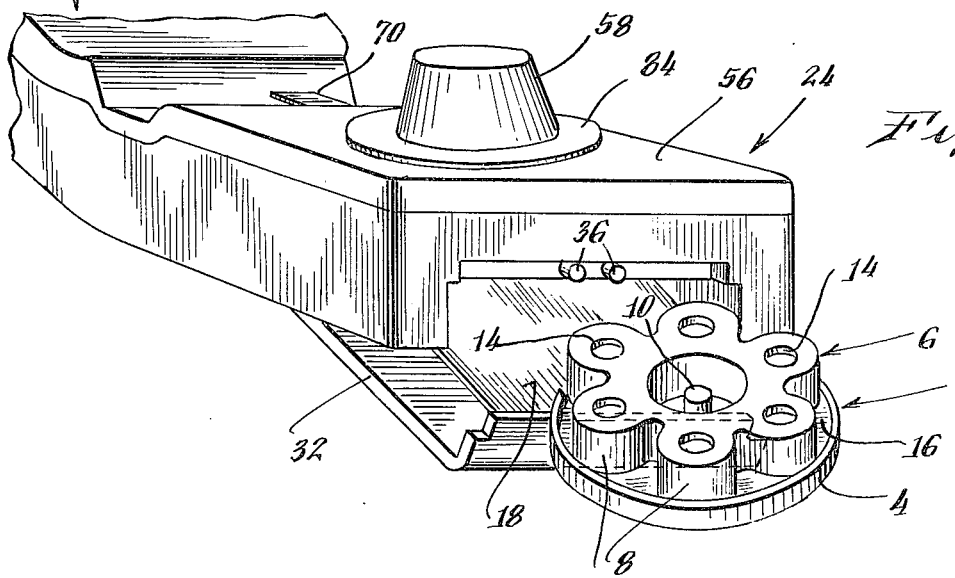

BATTERY TEST UNIT FOR TESTING BATTERIES WHILE STORED IN A CASSETTE-TYPE PACKAGE

BACKGROUND OF THE INVENTION

1. Field of the Invention

This invention relates to a battery test unit for testing batteries while stored in a cassette-type package.

Disk-shaped batteries B, typically smaller in diameter than a dime, used to power hearing aids, electrical or electronic watches, flash attachments for cameras, and other small battery powered devices are often packaged for sale and subsequently stored in cassette-type packages such as those shown in FIG. 2. Each battery B has a positive and a negative terminal, b+ and b—, on opposite faces of the disk structure. The cassette-type package generally comprises a housing 2 which includes a cylindrical base 4 and a cover 6 which is formed with a number of individual battery storage compartments 8 arranged in a circular pattern. The cover 6 is free to rotate with respect to the cylindrical base 4 on a central stud 10 so that each battery storage compartment 8 in succession may be positioned over a suitable trap door 12 in the base 4 which permits removal of the stored battery. This trap door 12 is illustrated in detail in FIG. 4. The cover of each storage compartment 8 is provided with a contact access opening 14 which exposes one terminal of the stored battery B.

A conductive base sheet 16 which contacts one terminal of each stored battery is positioned between the assembled cylindrical base 4 and the housing cover 6 and is provided with a tab 18 that projects away from the housing 2. This base sheet 16 may be a cardboard sheet having a coating of aluminum or other conductive metal. Thus, when individual batteries B are stored in this cassette-type package one terminal of each is accessible through the contact access opening in the cover of the corresponding housing compartment and the other terminal of each makes electrical contact with the conductive base sheet 16. An electrical test circuit may then be completed by contacting one terminal of each stored battery through the corresponding contact access opening and by contacting the base sheet tab 18.

The battery test unit of the present invention may be used to quickly, conveniently test batteries while stored in such a cassette-type package at the operator's home or office or at any other location where desired. This case of operation and convenience and the mobility of this battery test unit is particularly important for older persons who must replace dead batteries in hearing aids in order to effectively communicate with other people and who wish to be assured that the replacement battery is fully charged.

DESCRIPTION OF THE PRIOR ART

A variety of devices are presently known for testing batteries of various sizes and shapes. For example, battery testing apparatus are disclosed in U.S. Pat. Nos. 2,480,063 - Wall, 2,093,983 - Rothenberg, 2,640,099 - Hull, 3,586,962 - Rebstock, and 3,038,121 - Gray et al. U.S. Pat. No. 1,887,656 - Myers discloses one use of a rotary switch in connection with a battery water-level test unit.

In addition, cassette-type packages, and various aspects of them, for storing small disk-type batteries are disclosed in U.S. Pat. Nos. 2,542,575; 2,542,710; and 2,712,565.

However, none of these prior art patents discloses a handheld, manually operated battery test unit for testing batteries while stored in a cassette-type package.

SUMMARY OF THE INVENTION

In a preferred embodiment to be described in detail below, the battery test unit of the present invention for testing batteries while stored in a cassette-type package, such as that described above, is a handheld, manually operated device which may be easily, conveniently used in the operator's home or office or at any location convenient to the operator. This battery test unit comprises a body having a receptacle region for receiving the cassette-type package and a contact head mounted in this receptacle region. The contact head has a plurality of contacts, each positioned for simultaneous insertion through different cassette compartment access openings 14 to make electrical connection with one terminal of each battery B stored in the corresponding cassette housing compartment 8, when the cassette-type package is received in the receptacle region. This battery tester further comprises a selector switch for selectively individually making electrical connection with each of the plurality of contacts in the contact head. This selector switch may be of the rotary type which includes a shaft mounted in the battery test unit body, a rotary blade mounted on the shaft for selectively, individually contacting each of the contacts, and a knob mounted on the shaft permitting manual rotation of the blade. A voltmeter for testing each battery and calibrated to indicate battery charge is mounted in the battery test unit body and is connected electrically to the selector switch. A main contact is positioned in the battery test unit body to make electrical connection with the cassette base sheet when the cassette-type package is received in the receptacle region. This main contact is also electrically connected to the voltmeter. Thus, when the cassette-type package is received in the battery test unit, and the selector switch is positioned so that its blade contacts one of the contacts in the contact head, a series circuit is formed comprising the selector switch, the voltmeter, the cassette base sheet, and the battery.

In addition, two contacts are positioned on the exterior of the battery test unit and are connected to the voltmeter. These contacts are mounted in appropriately spaced relation to receive an individual disk-shaped battery for auxiliary testing outside of the cassette-type package.

The cassette-type package is positioned in the receptacle region by a contour recess having a shape the same as the cassette-type package cover 6. In addition, a hinged door on the bottom of the battery test unit provides access for this package to the receptacle region.

Accordingly, it is an object of the present invention to provide an unique and novel battery test unit for testing disk-shaped batteries while stored in a cassette-type package.

Other objects, aspects, and advantages of the present invention will be pointed out in or will be understood from the following detailed description when considered in conjunction with the accompanying drawings, which are briefly described below and show the presently preferred mode of putting the invention into practice.

BRIEF DESCRIPTION OF THE DRAWINGS

FIG. 1 is a perspective view of the battery test unit of the present invention for testing disk-shaped batteries while stored in a cassette-type package. This view illustrates the knob for selecting which battery in the cassette-type package is to be tested and the indication panel on the voltmeter which indicates the battery's charge;

FIG. 2 is a perspective view of the cassette-type package used for storing disk-shaped batteries described in detail above;

FIG. 3 is a cross-sectional view of this battery test unit taken through plane 3—3 in FIG. 1 looking toward the right which illustrates in detail its various components and shows how the cassette-type package is received in the receptacle region;

FIG. 4 is a cross-sectional view of this battery test unit taken through discontinuous plane 4—4 of FIG. 3 looking toward the left, and illustrating various features of the cassette-type package;

FIG. 5 is a bottom plan view of this battery test unit partly broken away to show the correct position of the cassette-type package when received in the body receptacle region;

FIG. 6 is a top plan view of this battery test unit; and

FIG. 7 is a perspective view of this battery test unit illustrating how the cassette-type package is received into the body receptacle region through the bottom-opening receptacle door.

DETAILED DESCRIPTION OF THE PREFERRED EMBODIMENT OF THE PRESENT INVENTION

FIGS. 1, 3, 4 and 5 illustrate the preferred embodiment of the battery test unit of the present invention with a cassette-type package in position for testing the batteries stored in it. This battery test unit includes a body 20 formed with an upper and a lower section, 22 and 24 respectively, which are integrated to form a gentle obtuse angle as shown in FIG. 3. This construction comfortably fits the palm and fingers of the hand to facilitate manual operation of this battery test unit. Additionally, the unit is assembled from top and bottom pieces, 26 and 28 respectively, which may be taken apart to provide access to the unit's inner components.

As shown in detail in FIGS. 3 and 4, the lower section 24 of the body 20 houses a receptacle region 30 into which the cassette-type package is inserted. A receptacle door 32, mounted on a hinge 34 (FIG. 3) on the bottom of the lower body section 24 provides access to this receptacle region 30 for the cassette-type package. The door is held in a closed position by a pair of spring loaded plugs 36 (FIG. 3) which engage a corresponding depression 38 on the inside of a lip on the door 32.

As shown in FIG. 7, the receptacle door 32 swings downwardly to accept the cassette-type package for insertion into the body receptacle region.

Also as shown in detail in FIGS. 3 and 4, a contact head 40 forms the roof of the receptacle region. This contact head 40 comprises a partition 42 which spans the interior of the lower body section 24. Six passages 44 are disposed in a circular pattern in the partition 42 in order to align with the pattern of the contact access openings 14 in the cover 6 of the cassette-type package. Contact means comprising a cap 46, having a spring 48 attached to this cap, and a contact ball 50 also attached to the spring, are disposed in each hole 44. The cap, the spring, and the contact ball are all made of electrically conductive material such as brass or spring steel, and are arranged so that each contact ball 50 projects through the corresponding cassette-type package access opening to make firm contact with one terminal of each stored battery B when the package is received and properly positioned in the receptacle region.

The partition 42 of the contact head 40 is formed with a bottom recess 52 (FIGS. 4 and 5) having the same shape as the cover of the cassette-type package. This recess, then, serves to align the cover so that all of the respective contact balls 50 simultaneously become inserted through their corresponding contact access openings. All batteries stored in the cassette-type package are thus contacted simultaneously when the package is inserted into the receptacle region.

A rotary selector switch is mounted in the lower section 24 of the body 20. This switch includes a shaft 54 mounted for rotation in the upper wall 56 of this lower body section. A knob 58 is secured to the top of the shaft 54 to permit manual rotation of it. A rotary blade arm 60 is carried at the lower end of the shaft 54 and extends radially away from the shaft axis. This arm is made of a resilient conductive material such as spring steel or copper and is of length sufficient to make contact with each of the contact caps 46 which are arranged in a circular pattern and consequently are located on the circumference of the circle described by the rotary blade. As shown in FIG. 3, this blade arm is making contact with the left-most contact cap. The operator of the battery test unit of the present invention may select the battery to be tested by rotating the knob 58, thereby rotating the blade arm 60 to make contact individually with each contact cap 46.

A contact bar 62 (FIG. 3) is seated on the selector switch shaft 54 to permit rotation of this shaft and extends through the rear wall 64 of the lower section of the body. Spacer sleeves 66 and 68 (FIGS. 3 and 4), mounted on the selector shaft 54 sandwich this contact bar on the shaft and insure firm electrical contact with it.

A main contact 67 is mounted in the lower body section and is positioned to make electrical connection with the conducting upper surface of the base sheet tab 16. This main contact may have a barb 69 to insure firm electrical connection with the conducting tab.

As shown in detail in FIG. 3, the contact bar 62 is provided with an extension portion 70 which forms an upper or first exposed accessible contact on the exterior of the body. A lower or second exposed accessible contact 72, is mounted on the body surface and is spaced apart from the first exposed contact 70. This second contact is connected to the main contact 67. These exposed contacts 70, 72 form an external testing station for conveniently testing an individual battery not stored in the cassette-type package. The battery test unit of the present invention further includes a voltmeter 74 mounted in the upper body section 22 held by four positioning screws 76. One terminal of the voltmeter 74 is connected to the main contact 67 by means of a lead 78 and the other terminal connected to the contact bar 62 by means of a second lead 80. Thus, when a cassette-type package is received in the receptacle region, a series circuit may be completed through one terminal of a battery, a ball contact 50, a spring 48, a contact cap 46, the blade arm 60, the shaft 54, the contact bar 62, lead 80, the voltmeter 74, lead 78 the main contact 67 and through the conductive surface of the base sheet tab 18, to the other terminal of the battery.

Alternatively, a series test circuit may be completed with the terminals of a battery inserted in the external test station 70, 72. This series circuit can be traced in FIG. 3 from one battery terminal through the upper exposed contact 70, the lead 80, the voltmeter 74, the lead 78, the main contact 67 and through lower exposed contact 72, to the other terminal of the battery.

As shown in FIG. 3, the selector switch knob 58 is provided with a pointer 82 which points in the same direction as does the blade arm 60. An indicator 84 (FIG. 6) is mounted on the top of the lower body section 22 and is provided with numbers one through six. Accordingly, when the pointer 82 indicates that the blade arm is in position 1, as shown in FIG. 6, the battery stored in the cassette-type package in compartment 1 will be tested. Similarly, the operator may test any of the other batteries stored in compartments 2 through 6 by rotating the knob until the pointer indicates the number corresponding with the compartment containing the battery which the operator wishes to test.

Also as shown in FIG. 6, the voltmeter may be provided with an easily understandable scale 86 so that an operator having no knowledge of electricity or electronics will nevertheless be able to determine whether or not a particular battery is adequately charged. For example, the scale may have "smile faces" such as those illustrated. The face bearing a frown 88 indicates the inadequate battery charge; the neutral face 90 indicates poor battery charge; and the smiling face 92 indicates adequate battery charge.

The battery test unit of the present invention is operated as follows: The receptacle door 32 is opened. The operator inserts the cassette-type package as shown in FIG. 7 into the receptacle region 30 of the battery test unit. The cover 6 of the cassette-type package should be aligned with the recess 52 in the contact head 40. In this fashion, all contact balls 50 are simultaneously aligned to become inserted through the corresponding contact access openings 14 in this cover to make contact with one terminal of each stored battery, when the receptacle door 32 is fully closed with the detents 36 snapped into the sockets 38. The receptacle door 32 has a clearance opening 93 (FIG. 4) to accommodate the trap door 12 in the base of the cassette.

After the receptacle door is fully closed, the operator then selects which battery he wishes to test by rotating the knob 58 to the appropriately indicated position. The voltmeter automatically responds upon completion of the circuit by positioning of the selector switch knob. The operator may then test sequentially each of the stored batteries to determine if each has adequate charge.

As shown in FIG. 1, a series of manually movable reminder levers 94 may be provided which can be pivoted into different positions. Accordingly, if any battery tested is found to be inadequately charged, the operator may throw the appropriate reminder lever 94 into a different position to remind him of the battery's weakness. An individual battery may be tested by inserting it into the exposed test station between the first and second exposed contacts 70 and 72. Again, the voltmeter will automatically respond to indicate the charge condition of the battery.

After the testing operation is completed, the cassette-type package containing the tested batteries may be removed merely by opening the hinged receptacle door and dropping the cassette-type package out of the receptacle region 30.

The battery test unit of the present invention for testing batteries while stored in a cassette-type package provides several unique advantages. It is handheld and manually operated for convenience. It may be easily operated by anyone with or without knowledge of electricity or electronics. It is designed to indicate in readily understandable fashion whether or not small disk-shaped batteries stored in such cassette-type packages are adequately charged or not. This is particularly important for operators who are older and use such batteries in hearing aids, for example. Replacement batteries are often needed quickly and it is most assuring to such a person that the batteries used for replacement are adequately charged. Additionally, the battery test unit of the present invention provides an easy means for testing individual batteries in the form of the exposed test station.

Although a specific embodiment of the present invention has been disclosed in detail above, it is to be understood that this is for purposes of illustration. This disclosure is not to be construed as limiting the scope of the invention, since the described structure may be changed in details by those skilled in the art in order to adapt the battery test unit of the present invention to special applications.

I claim:

1. A battery test unit for testing batteries while stored in a cassette-type package having an electrically conductive sheet base and a housing mounted on the base, with said electrically conductive sheet base being accessible at the outside of said housing, said housing forming a plurality of individual compartments each for storing an individual battery and having a contact access opening in each compartment, the housing and base being arranged to store each battery with one terminal in electrical contact with the conductive sheet base and the other terminal accessible through the contact access opening, said battery test unit comprising:

a body having a receptacle region for receiving the cassette-type package;

main contact means in said unit and being positioned near said receptacle region for making electrical connection with the electrically conductive sheet base of a cassette-type package received in said body receptacle region for simultaneously making electrical connection to the one terminal of each battery in said package which is in electrical contact with said conducting base sheet;

movable selector means in said unit for selectively individually making electrical connection through the cassette compartment access openings with one terminal of each battery stored in the corresponding cassette housing compartments of the cassette-type package received in said body receptacle region;

meter means in said unit for testing each battery for metering the charge condition of the battery, said meter means being electrically connected to said selector means and to said main contact means; and indicator means in said unit associated with said meter means for indicating the charge condition of the individual battery with which said selector means is making electrical connection.

2. A battery test unit for testing batteries while stored in a cassette-type package as claimed in claim 1, in which:

said movable selector means in said test unit is rotatable into different positions for individually making electrical connection with one terminal of each battery by a manually operable knob on the outside of said unit, and position indicating means on the outside of said test unit for indicating which one of the individual batteries is being tested corresponding to each different position of said knob.

3. A battery test unit for testing batteries while stored in a cassette-type package having an electrically conductive base and a housing mounted on the base, with said electrically conductive base being accessible at the outside of said cassette-type package, said housing forming a plurality of compartments each for storing an individual battery and having a contact access opening in each compartment, the housing and base being arranged to store each battery with one terminal in electrical contact with the conductive sheet base and with the other terminal accessible through the contact access opening, said battery tester comprising:

a body having a receptacle region for receiving the cassette-type package;

main contact means being positioned in said unit near said receptacle region for making electrical connection at the outside of said cassette-type package with the electrically conductive base of the package inserted into said body receptacle region for simultaneously making electrical connection to the terminals of each of the batteries in said package which are in electrical contact with said base, contact head, mounted in said body receptacle region, having a plurality of contacts each positioned for simultaneous insertion through a difference cassette compartment access opening to make electrical connection with one terminal of each battery stored in the corresponding cassette housing compartment when the cassette-type package is inserted into said body receptacle region;

movable selector means in said unit manually movable into different positions for selectively individually making electrical connection with each contact of said contact head;

meter means in said unit for testing each battery for metering the charge condition of the battery, said meter means being electrically connected to said movable selector means and to said main contact means; and indicator means in said unit associated with said meter means for indicating the charge condition of the individual battery with which said selector means is making electrical connection.

4. A battery test unit for testing batteries while stored in a cassette-type package, as claimed in claim 1, further comprising:

hinged door means mounted on said body providing access for the cassette-type package to be inserted into said receptacle region.

5. A battery test unit for testing batteries while stored in a cassette-type package, as claimed in claim 3, further comprising:

a first exposed contact on the exterior of said body electrically connected to said meter means; and a second exposed contact on the exterior of said body also electrically connected to said meter means spaced from said first contact for accepting an individual battery, between said first and second exposed contacts for testing.

6. A battery test unit for testing batteries while stored in a cassette-type package, as claimed in claim 3, in which:

said contact head is provided with an alignment recess having the same shape as the cassette-type package housing for positioning said package with respect to said contact head such that the respective contacts of said contact head are inserted through the respective access openings of the housing when the cassette-type package is inserted into said body receptacle region.

7. A battery test unit for testing batteries while stored in a cassette-type package, as claimed in claim 3, in which:

said contact head includes a partition having one side located near said receptacle region mounting a plurality of spring-biased contacts accessible on said side of the partition for simultaneous insertion through the respective access openings of a cassette-type package inserted into said receptacle region to make electrical connection with the respective terminals of the individual batteries;

said partition also mounting a plurality of electrically conductive elements on the opposite side thereof from said receptacle region;

each of said elements being electrically connected to a respective one of said spring-biased contacts; and said movable selector means includes a manually movable conductive member individually engageable with each of said elements.

* * * * *